United States Patent
Lin et al.

(10) Patent No.: US 7,314,820 B2
(45) Date of Patent: Jan. 1, 2008

(54) CARRIER-FREE SEMICONDUCTOR PACKAGE AND FABRICATION METHOD THEREOF

(75) Inventors: Yu-Wei Lin, Taichung Hsien (TW); Fu-Di Tang, Taichung Hsien (TW); Chun-Yuan Li, Taichung Hsien (TW); Terry Tsai, Taichung Hsien (TW); Yu-Ting Ho, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 289 days.

(21) Appl. No.: 11/042,939

(22) Filed: Jan. 24, 2005

(65) Prior Publication Data
US 2006/0121647 A1   Jun. 8, 2006

(30) Foreign Application Priority Data
Dec. 2, 2004   (TW) .............................. 93137145 A

(51) Int. Cl.
| | |
|---|---|
| H01L 21/44 | (2006.01) |
| H01L 21/50 | (2006.01) |
| H01L 21/48 | (2006.01) |
| H01L 23/52 | (2006.01) |
| H01L 23/48 | (2006.01) |
| H01L 23/495 | (2006.01) |
| H01L 23/498 | (2006.01) |

(52) U.S. Cl. ............ 438/617; 438/106; 438/123; 257/784; 257/787; 257/E23.031; 257/E23.061; 257/676

(58) Field of Classification Search ........... 438/617, 438/106, 123–124; 257/784, 787, 676, E23.031, 257/E23.037, E23.061
See application file for complete search history.

(56) References Cited

U.S. PATENT DOCUMENTS

| | | | |
|---|---|---|---|
| 5,107,325 A * | 4/1992 | Nakayoshi | 257/793 |
| 5,830,800 A | 11/1998 | Lin | |
| 6,072,239 A | 6/2000 | Yoneda et al. | |
| 6,498,099 B1 * | 12/2002 | McLellan et al. | 438/689 |
| 6,770,959 B2 | 8/2004 | Huang et al. | |
| 6,777,265 B2 * | 8/2004 | Islam et al. | 438/111 |
| 6,955,942 B2 * | 10/2005 | Kobayashi et al. | 438/106 |
| 6,955,949 B2 * | 10/2005 | Batish et al. | 438/125 |
| 7,052,492 B2 * | 5/2006 | Swanson et al. | 606/32 |
| 7,125,747 B2 * | 10/2006 | Lee et al. | 438/112 |

* cited by examiner

*Primary Examiner*—Luan Thai
(74) *Attorney, Agent, or Firm*—Peter F. Corless; Steven M. Jensen; Edwards Angell Palmer & Dodge LLP

(57) ABSTRACT

A carrier-free semiconductor package and a fabrication method thereof are provided. The fabrication method includes the steps of: providing a carrier having a plurality of electrical contacts formed thereon; mounting at least one chip on the carrier; electrically connecting the chip to the electrical contacts via a plurality of bonding wires; forming a coating layer on each of the electrical contacts to encapsulate a bonded end of each of the bonding wires on the electrical contacts; performing a molding process to form an encapsulant for encapsulating the chip, the bonding wires and the electrical contacts; and removing the carrier, such that bottom surfaces of the electrical contacts are exposed from the encapsulant. This obtains a semiconductor package not having a carrier, and the coating layers can enhance adhesion between the electrical contacts and the encapsulant.

18 Claims, 6 Drawing Sheets

CARRIER-FREE SEMICONDUCTOR PACKAGE AND FABRICATION METHOD THEREOF

FIELD OF THE INVENTION

The present invention relates to carrier-free semiconductor packages and fabrication methods thereof, and more particularly, to a wire-bonded semiconductor package not having a carrier, and a fabrication method of the semiconductor package.

BACKGROUND OF THE INVENTION

For a conventional quad flat non-leaded (QFN) semiconductor package with a lead frame, a plurality of leads surrounding a die pad of the lead frame are usually formed with stepped structures or anchoring structures. As shown in FIGS. 1A, 1B and 1C, the stepped structures 41 of the leads 40 in FIG. 1B or the anchoring structures 42 of the leads 40 in FIG. 1C can increase a contact area between an encapsulant 43 and the leads 40 and thus enhance the adhesion therebetween. Such arrangement prevents delamination of the leads 40 or encapsulant 43, and also provides protection for a chip 44 and bonding wires 45 incorporated in the semiconductor package, thereby assuring the structural reliability and electrical quality of the semiconductor package.

However, in accordance with the development of light-weight and small-profile semiconductor products, the conventional lead frame having a limitation on its thickness makes the height of the lead-frame-based semiconductor package not able to be further reduced, and as a result, a carrier-free semiconductor package structure has been produced. The carrier-free semiconductor package does not use the conventional lead frame and thus has a significantly smaller thickness than that of the lead-frame-based package. This overcomes the conventional structural limitation as to failure in reducing the thickness of the semiconductor package.

The above carrier-free semiconductor package advantageously has a reduced thickness, however, it may encounter the problem of delamination of an encapsulant or cracks of bonding wires, etc. due to the absence of the lead frame. For example, referring to FIGS. 2A and 2B showing a semiconductor package disclosed in U.S. Pat. No. 5,830,800, a plurality of electroplated pads 51 are formed on a copper carrier 50 according to predetermined circuitry, wherein each of the electroplated pads 51 comprises Au/Pd/Ni/Pd (gold/palladium/nickel/palladium) plated layers and is approximately 6 μm thick. Then, at least one chip 52 is mounted on the copper carrier 50 and is electrically connected to the electroplated pads 51 via a plurality of bonding wires 53. As shown in FIG. 2B, an encapsulant 54 is formed and encapsulates the chip 52 and the bonding wires 53. Subsequently, the copper carrier 50 is etched off. Finally, a plurality of solder balls 55 are implanted on the electroplated pads 51 to be electrically connected to an external device, such that a singulation process can be performed, and a carrier-free semiconductor package is fabricated.

By comparing the conventional semiconductor package shown in FIG. 1A having the bonding wires 45 connected to the leads 40, and the above semiconductor package of FIGS. 2A and 2B having the bonding wires 53 bonded to the electroplated pads 51, since the thickness of the electroplated pads 51 is merely about 6 μm and much smaller than the thickness (generally up to 200 μm) of the leads 40 in FIG. 1A, the electroplated pads 51 cannot be firmly held by the encapsulant 54 unlike the leads 40 that can be easily held. This thereby causes peel-off of the electroplated pads 51 and detachment of the bonding wires 53. Further due to the insufficient adhesion between the encapsulant 54 and the electroplated pads 51, the electroplated pads 51 may possibly be delaminated from the encapsulant 54 after a surface-mounting process.

Moreover, the topmost Pd layer of the electroplated pad 51 has a much different coefficient of thermal expansion (CTE) from that of the encapsulant 54 and is weakly adhesive to the encapsulant 54. This would cause a delamination problem due to the CTE mismatch and even lead to cracks of the bonding wires 53. Furthermore, when the semiconductor package is mounted on a printed circuit board via the electroplated pads 51, in case the electroplated pads 51 cannot be firmly held by the encapsulant 54, this may similarly result in peel-off of the electroplated pads 51 due to the CTE mismatch between the semiconductor package and the printed circuit board, thereby seriously affecting the quality of the semiconductor package.

U.S. Pat. No. 6,770,959 has disclosed a semiconductor package shown in FIG. 3. In this semiconductor package, a lead layer 62 and a die pad layer 63 are firstly formed and defined by a solder mask layer 61. Then, a chip 64 is mounted on the die pad layer 63 and is electrically connected to corresponding positions of the lead layer 62 via a plurality of bonding wires 65. Subsequent conventional fabrication processes are performed to form an encapsulant 66 and complete the semiconductor package. This conventional packaging technology similarly encounters the above problem such as insufficient adhesion. Unlike the foregoing lead frame with stepped or anchoring structures, the encapsulant 66 and the lead layer 62 are still subject to delamination and cause cracks of the bonding wires 65.

Alternatively, another conventional packaging technology using a bumpless chip carrier has been proposed in U.S. Pat. No. 6,072,239. As shown in FIG. 4, a plurality of recessed electroplated pads 71 are formed on the chip carrier and are electrically connected to a chip 73 via a plurality of bonding wires 72, and an encapsulant 74 is used to encapsulate the chip 73 and the plurality of bonding wires 72 so as to fabricate a package structure. This packaging technology similarly incurs the problem that the recessed electroplated pads 71 and the encapsulant 74 are not well bonded to each other, which thus causes detachment of the bonding wires 72 and peel-off of the electroplated pads 71, and leads to the structural drawback of insufficient adhesion.

Therefore, the problem to be solved here is to provide a carrier-free semiconductor package and a fabrication method thereof, which can reduce the thickness of the semiconductor package, and assure the adhesion of an encapsulant, as well as protect the package structure and the electrical quality of bonding wires.

SUMMARY OF THE INVENTION

In light of the above drawbacks in the prior art, an objective of the present invention is to provide a carrier-free semiconductor package and a fabrication method thereof, so as to enhance the adhesion between bond pads and an encapsulant.

Another objective of the present invention is to provide a carrier-free semiconductor package and a fabrication method thereof, which can eliminate mismatch in coefficient of thermal expansion (CTE) between bond pads and an encapsulant.

Still another objective of the present invention is to provide a carrier-free semiconductor package and a fabrication method thereof, which can prevent cracks of bonding wires.

A further objective of the present invention is to provide a carrier-free semiconductor package and a fabrication method thereof, which can prevent detachment of bond pads.

A further objective of the present invention is to provide a carrier-free semiconductor package and a fabrication method thereof, so as to reduce the thickness of the semiconductor package.

In accordance with the above and other objectives, the present invention proposes a fabrication method of a carrier-free semiconductor package, comprising the steps of: providing a carrier having a plurality of electrical contacts formed thereon; mounting at least one chip on the carrier; performing a wire-bonding process to electrically connect the chip to the plurality of electrical contacts via a plurality of bonding wires; forming a coating layer on each of the electrical contacts to encapsulate a bonded end of each of the bonding wires on the electrical contacts; performing a molding process to form an encapsulant on the carrier to encapsulate the chip, the bonding wires and the electrical contacts; and removing the carrier, such that bottom surfaces of the electrical contacts are exposed from the encapsulant.

The present invention also proposes a carrier-free semiconductor package, comprising: at least one chip; a plurality of electrical contacts; a plurality of bonding wires for electrically connecting the chip to the plurality of electrical contacts; a coating layer formed on each of the electrical contacts and for encapsulating a bonded end of each of the bonding wires on the electrical contacts; and an encapsulant for encapsulating the chip, the bonding wires and the electrical contacts, with bottom surfaces of the electrical contacts being exposed from the encapsulant.

The fabrication method in the present invention further comprises the steps of implanting solder balls respectively on the bottom surfaces of the electrical contacts that are exposed from the encapsulant after the carrier is removed, and performing a singulation process to form a plurality of semiconductor packages.

Moreover, the coating layer can be made of a polymer material such as resin, PI (polyimide) or silicone, and completely covers each of the electrical contacts. The electrical contacts are thin contact, which can be optionally electroplated pads or bump leads.

Therefore, the foregoing coating layers provided on the electrical contacts effectively enhance the bonding strength between the bonding wires and the electrical contacts, such that peel-off of the electrical contacts such as electroplated pads in a subsequent surface-mounting process can be prevented, and delamination of the electroplated pads from the encapsulant can be avoided, thereby solving the problems in the prior art.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
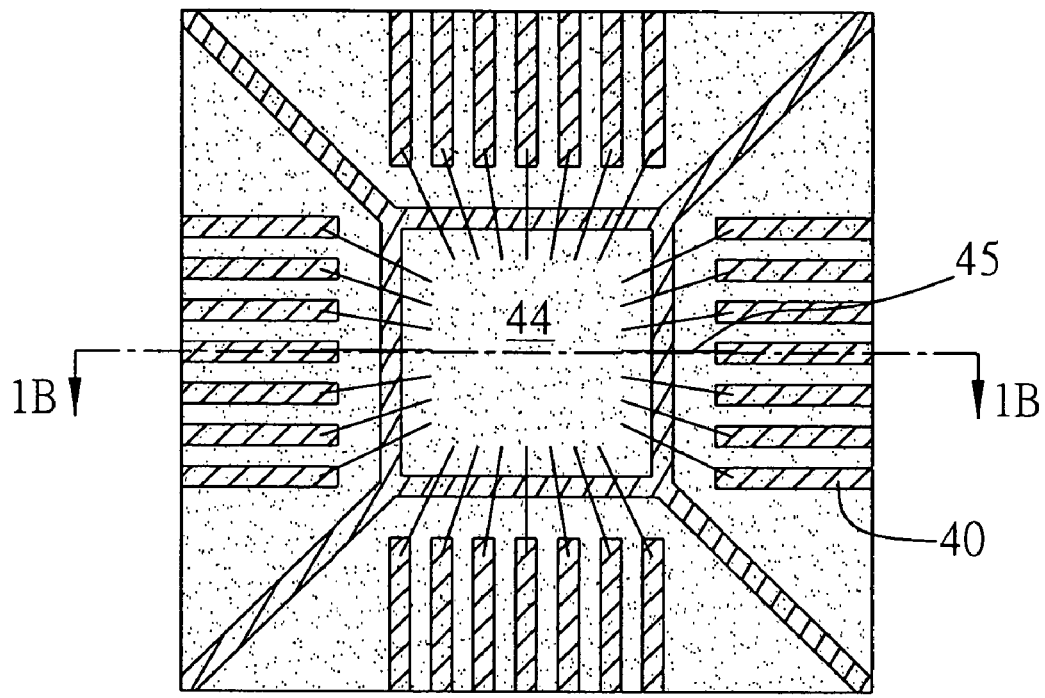
FIGS. 1A to 1C (PRIOR ART) are schematic diagrams of a conventional lead-frame-based semiconductor package.
Figure 1B:
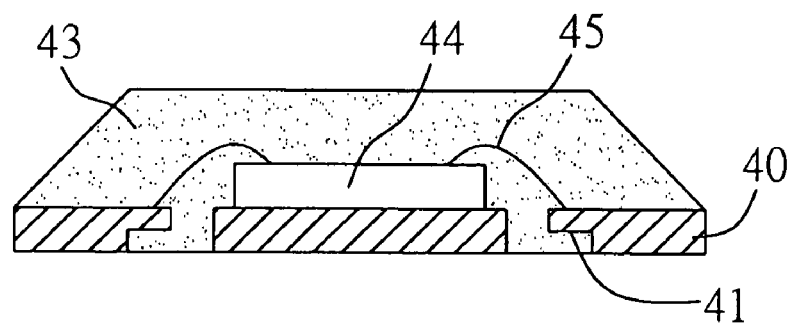
Figure 1C:
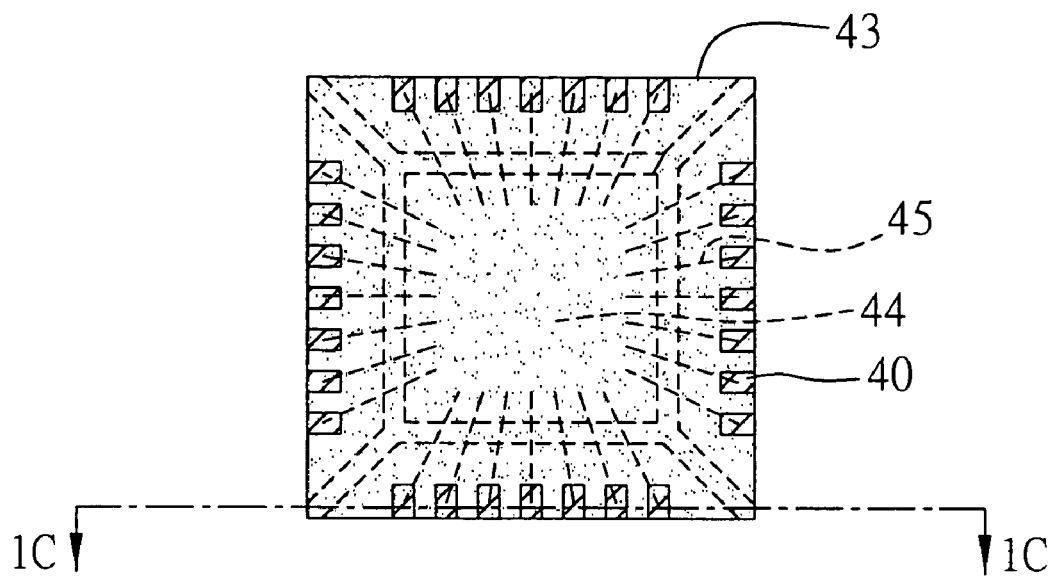
Figure 1C:
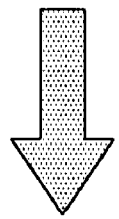
Figure 1C:
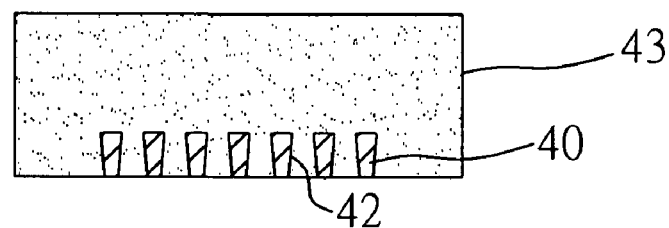
Figure 2A:
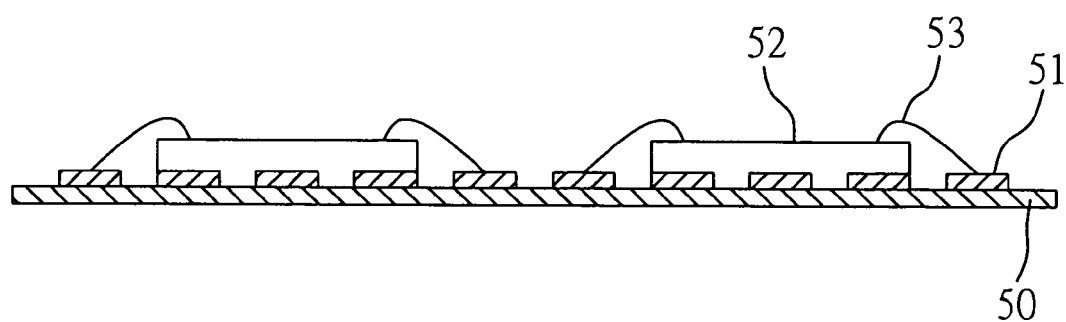
FIGS. 2A and 2B (PRIOR ART) are schematic diagrams of a flowchart showing a fabrication method of a semiconductor package disclosed in U.S. Pat. No. 5,830,800.
Figure 2B:
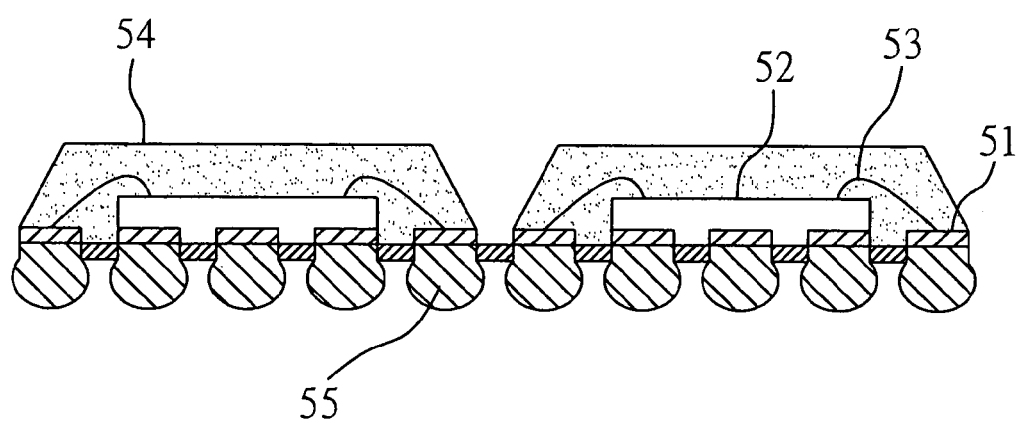
Figure 3:
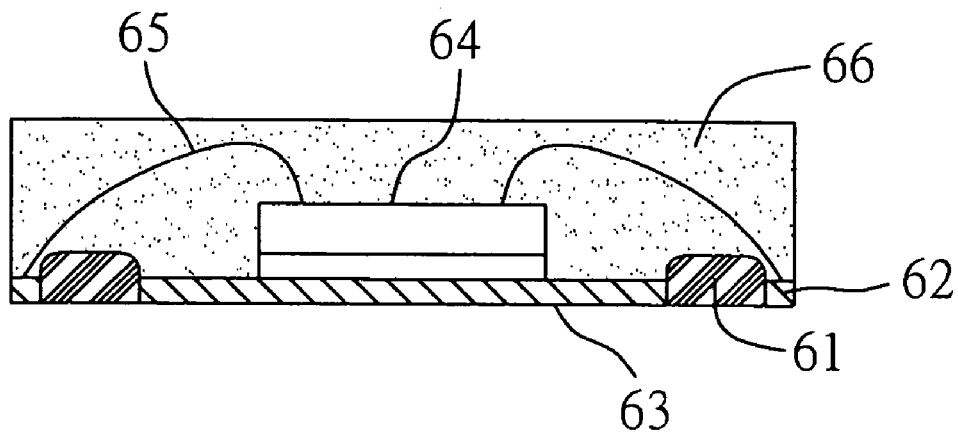
FIG. 3 (PRIOR ART) is a cross-sectional view of a semiconductor package disclosed in U.S. Pat. No. 6,770,959.
Figure 4:
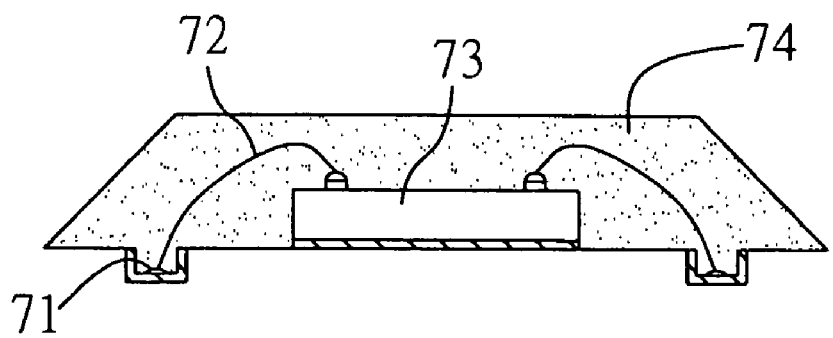
FIG. 4 (PRIOR ART) is a cross-sectional view of a semiconductor package disclosed in U.S. Pat. No. 6,072,239.

A fabrication method of a carrier-free semiconductor package proposed in the present invention are described in detail with reference to FIGS. 5A to 5G. First referring to FIG. 5A, a copper carrier 10 is provided, which is patterned to form a die pad 12 thereon and a plurality of electrical contacts 11 around the die pad 12 according to predetermined circuitry. The electrical contacts 11 are thin electroplated pads each comprising such as Au/Pd/Ni/Pd (gold/palladium/nickel/palladium) electroplated layers, so as to satisfy the requirement of profile miniaturization. Then, referring to FIG. 5B, a chip 15 is mounted on the die pad 12 of the carrier 10, and a wire-bonding process is performed to electrically connect the chip 15 to the plurality of electrical contacts 11 via a plurality of bonding wires 20. In order to assure the bonding strength of the bonding wires 20, referring to FIG. 5C, a coating layer 25 is applied on each of the electrical contacts 11 to completely cover the corresponding electrical contact 11 and encapsulate a bonded end of each of the bonding wires 20 on the electrical contacts 11, such that the bonding strength of the bonding wires 20 can be enhanced and peel-off of the electrical contacts 11 is avoided. The coating layer 25 can be a polymer material layer made of such as resin, polyimide (PI) or silicone.

Figure 5A:
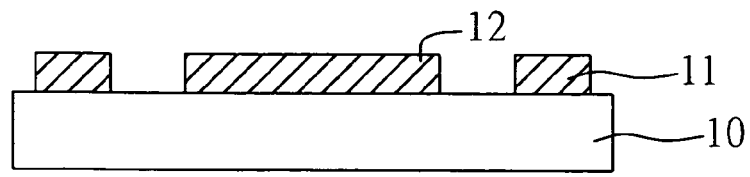
FIGS. 5A to 5G are schematic diagrams of a flowchart showing a fabrication method of a semiconductor package according to the present invention.
Figure 5B:
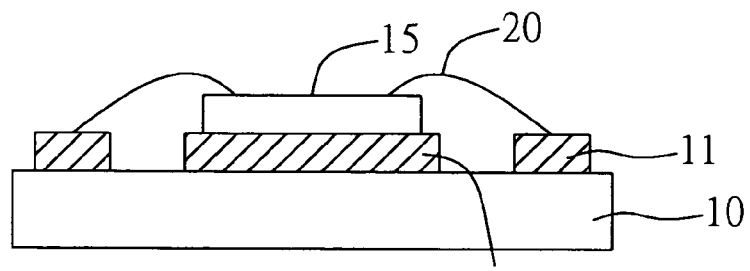
Figure 5C:
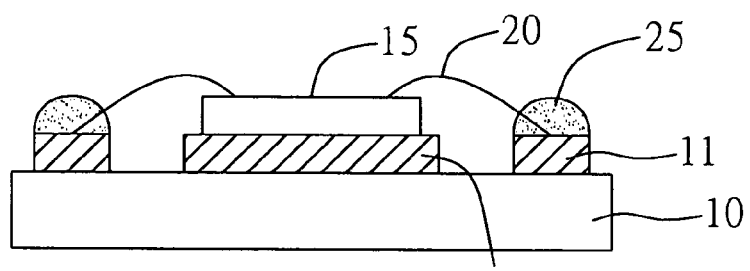
Figure 5D:
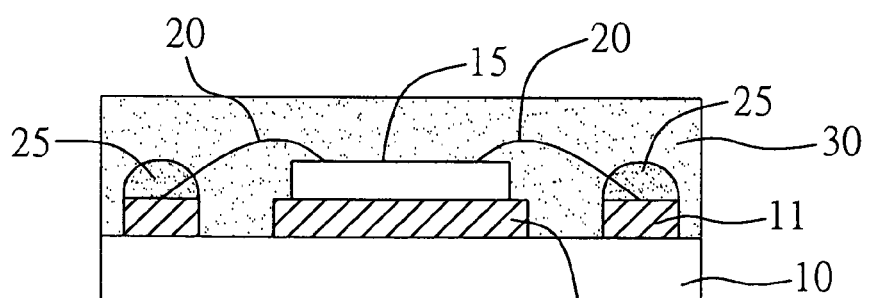
Figure 5E:
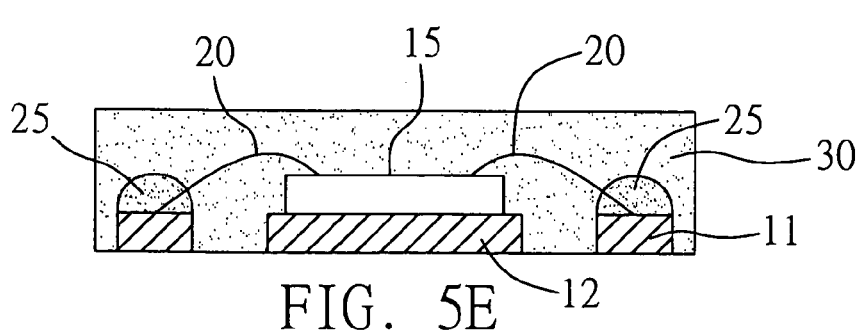
Figure 5F:
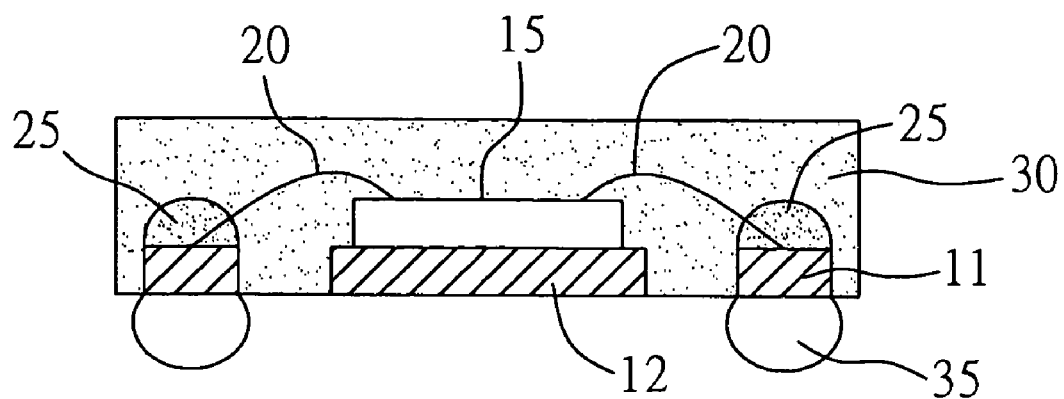

Referring to FIG. 5D, a molding process is performed to fabricate an encapsulant 30 on the carrier 10. The encapsulant 30 is used to encapsulate the chip 15, the bonding wires 20 and the electrical contacts 11 so as to protect the chip 15 and the bonding wires 20. The encapsulant 30 can be made of a resin material. As such, the coating layers 25 are located between the electrical contacts 11 and the encapsulant 30. Subsequently, referring to FIG. 5E, the carrier 10 is removed by for example an etching technique, such that bottom surfaces of the electrical contacts 11 are exposed from the encapsulant 30 and can be electrically connected to an external device. Alternatively, referring to FIG. 5F, a plurality of solder balls 35 are implanted on the exposed bottom surfaces of the electrical contacts 11 respectively, such that the chip 15 can be electrically connected to an external electronic device such as a printed circuit board via the solder balls 35. Finally, referring to FIG. 5G, a singulation process is performed to cut the encapsulant 30, and thus the desirable semiconductor package is fabricated.

Apart from forming the patterned electroplated pads on the carrier 10, in the present invention, the electroplated pads may also be replaced by conductive bumps to form metallic bump leads on the carrier 10, and similarly the chip 15 can be electrically connected to the bump leads via the plurality of bonding wires 20. Such arrangement also provides the desirable effects in the present invention. Moreover, apart from mounting the chip 15 on the die pad 12 of the carrier 10, the chip 15 may also be directly disposed on a predetermined position of the carrier 10, and this predetermined position serves as a temporary chip carrier; the carrier 10 would be removed after the molding process.

Figure 5G:
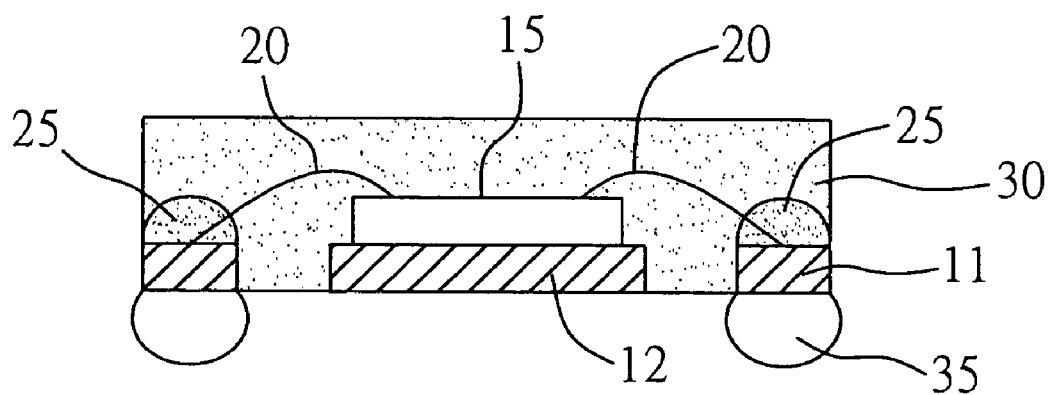

As shown in FIG. 5G, a carrier-free semiconductor package, which is fabricated by the above method in the present invention, comprises: a chip 15 and a plurality of electrical contacts 11, wherein the chip 15 is electrically connected to the electrical contacts 11 via a plurality of bonding wires 20; a coating layer 25 applied on each of the electrical contacts 11 and for encapsulating a bonded end of each of the bonding wires 20 on the electrical contacts 11 so as to enhance the bonding strength of the bonding wires 20; an encapsulant 30 for encapsulating the chip 15, the bonding wires 20 and the electrical contacts 11, with bottom surfaces of the electrical contacts 11 being exposed from the encapsulant 30; and a solder ball 35 implanted on each of the electrical contacts 11.

Therefore, the foregoing coating layers 25 serve as buffer layers to diminish mismatch in thermal expansion between the electrical contacts 11 and the encapsulant 30 and thus reduce thermal stress to prevent the occurrence of delamination. Moreover, the coating layers 25 have satisfactory adhesion with the electrical contacts 11 and also with the encapsulant 30, such that the adhesion between the electrical contacts 11 and the encapsulant 30 can be enhanced by means of the coating layers 25. Thus, the electrical contacts 11 can be firmly held by the encapsulant 30 and the bonding strength of the bonding wires 20 is improved. This can desirably avoid the problems such as peel-off of the electrical contacts 11, cracks of the bonding wires 20, and delamination of the electrical contacts 11 from the encapsulant 30, etc.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a carrier-free semiconductor package, comprising the steps of:
    providing a carrier formed with a plurality of electrical contacts thereon;
    mounting at least one chip on the carrier;
    performing a wire-bonding process to electrically connect the chip to the plurality of electrical contacts via a plurality of bonding wires;
    forming a coating layer on each of the electrical contacts to encapsulate a bonded end of each of the bonding wires on the electrical contacts and a top face of each of the electrical contacts, the coating layer completely covering the top face of its corresponding electrical contact;
    performing a molding process to form an encapsulant on the carrier to encapsulate the chip, the bonding wires and the electrical contacts; and
    removing the carrier, such that bottom surfaces of the electrical contacts are exposed from the encapsulant.

2. The fabrication method of claim 1, further comprising after removing the carrier, implanting a plurality of solder balls on the exposed bottom surfaces of the electrical contacts respectively.

3. The fabrication method of claim 1, further comprising after removing the carrier, performing a singulation process to form the semiconductor package.

4. The fabrication method of claim 1, wherein the coating layer is a polymer material layer.

5. The fabrication method of claim 1, wherein the coating layer is made of a material selected from the group consisting of resin, polyimide and silicone.

6. The fabrication method of claim 1, wherein the electrical contact is a thin contact.

7. The fabrication method of claim 6, wherein the thin contact comprises gold/palladium/nickel/palladium electroplated metal layers.

8. The fabrication method of claim 1, wherein the electrical contact is an electroplated pad or a bump lead.

9. The fabrication method of claim 1, wherein the carrier is a copper carrier.

10. The fabrication method of claim 1, wherein the encapsulant is made of a resin material.

11. A carrier-free semiconductor package, comprising:
    at least one chip;
    a plurality of electrical contacts;
    a plurality of bonding wires for electrically connecting the chip to the plurality of electrical contacts;
    a coating layer formed on a top face of each of the electrical contacts to encapsulate a bonded end of each of the bonding wires on the electrical contacts, the coating layer completely covering the top face of its corresponding electrical contact; and
    an encapsulant for encapsulating the chip, the bonding wires and the electrical contacts, with bottom surfaces of the electrical contacts being exposed from the encapsulant.

12. The semiconductor package of claim 11, further comprising a plurality of solder balls implanted on the exposed bottom surfaces of the electrical contacts respectively.

13. The semiconductor package of claim 11, wherein the coating layer is a polymer material layer.

14. The semiconductor package of claim 11, wherein the coating layer is made of a material selected from the group consisting of resin, polyimide and silicone.

15. The semiconductor package of claim 11, wherein the electrical contact is a thin contact.

16. The semiconductor package of claim 15, wherein the thin contact comprises gold/palladium/nickel/palladium electroplated metal layers.

17. The semiconductor package of claim 11, wherein the electrical contact is an electroplated pad or a bump lead.

18. The semiconductor package of claim 11, wherein the encapsulant is made of a resin material.

* * * * *